United States Patent [19]

Owen

[11] Patent Number: 5,034,695

[45] Date of Patent: Jul. 23, 1991

[54] FULL THRESHOLD FM DEMODULATOR

[76] Inventor: Joseph C. Owen, 900 N. Curry Pike Lot 44A, Bloomington, Ind. 47401

[21] Appl. No.: 367,035

[22] Filed: Jun. 16, 1989

[51] Int. Cl.[5] .............................................. H03D 3/06
[52] U.S. Cl. .................................... 329/325; 455/208; 455/209; 455/337
[58] Field of Search ................ 329/323, 325; 455/214, 455/337, 208, 209, 210; 375/81, 97

[56] References Cited

U.S. PATENT DOCUMENTS

| | | | |
|---|---|---|---|
| 2,272,401 | 2/1942 | Chaffee | 455/210 |
| 3,437,941 | 4/1969 | Leary | 329/339 |
| 4,087,756 | 5/1978 | Rogers, Jr. | 329/325 |
| 4,523,324 | 6/1985 | Marshall | 329/325 X |

Primary Examiner—David Mis
Attorney, Agent, or Firm—Longacre & White

[57] ABSTRACT

A full threshold FM (Frequency Modulated) signal demodulator can be achieved by utilizing FM deviation compression feedback technics. An FM signal is coupled to a mixer (10) wherein a signal from a local oscillator is mixed. The output of the mixer is coupled to a selective IF amplifier. The IF amplifier couples the signal to a limiter amplifier, the output of the limiter is coupled to a parallel BPF and AM demodulator system. The output signal of the AM demodulators are summed by a summing amplifier. The output signal is simultaneously feed back through at least two frequency compensation networks. The output signal of the FCN is feedback to two BPFs (13 and 13'). Further, the output signal of the FCN is feedback to a local oscillator (17). The output of the local oscillator (17) is feedback into the mixer (10). The improved demodulated signal is sampled at an output (26).

22 Claims, 3 Drawing Sheets

FULL THRESHOLD FM DEMODULATOR

BACKGROUND ART

The use of threshold extension is becoming more widespread. A need for a "new and improved" demodulator affording full threshold extension and greatly improved reliability has become evident. Over the years it has been common to use phase detectors and phase locked loops in threshold extension applications. Certain barriers prevented optimum threshold extension. However, using a novel approach to solving these barriers lead to a new and unique way of demodulating FM in a deviation compression feedback FM demodulator, and now the use of narrower band pass filters in the IF stages and higher feedback loop gains is possible, permitting the fullest threshold extension possible. The effects of narrower band pass filters and higher feedback loop gain can be better understood in two publications entitled "Phase Locked Loops & Their Applications" by D. D. Carpenter, IEEE Press 1979, pages 178-181, and "Feedback and Control Systems" by A. C. McDonald/H. Lowe, Reston Publishing Co., Inc. 1981, pages 286-297 and 377-381 each of these providing insight to the effects of narrow band pass IF stages and high feedback loop gains. While other threshold extension demodulators provide a degree of improvement over conventional FM demodulators and especially conventional quadrature demodulators, there was still a need for a full threshold demodulator, and especially one providing a high degree of reliability.

SUMMARY OF THE INVENTION

In the instant invention, a signal containing FM of a prescribed FM deviation is mixed with a local oscillator to produce a converted IF signal now having a reduced FM deviation. This signal is selectively filtered in the IF amplifier stage(s) removing broadband noise and passing only a very narrow band containing the desired converted IF signal of reduced FM deviation. It is then amplified and limited by a limiter amplifier before it is supplied to a pair of voltage-tuned band pass filters. The first voltage-tuned band pass filter is tuned slightly higher in frequency than the IF center frequency, and the second is tuned slightly lower than the IF center frequency. The output of the first voltage-tuned band pass filter is amplitude demodulated in an AM demodulator providing a positive voltage. The output of the second voltage-tuned band pass filter which is also amplitude demodulated by a second AM demodulator which provides a negative output voltage. The two demodulated outputs are summed together in a summing amplifier providing a net difference signal.

If the incoming FM demodulator signal deviates higher or lower than the demodulator center frequency, the amplitudes of the voltage-tuned band pass filters produces a positive or negative net difference demodulation signal output corresponding to a positive or negative frequency excursion. The band width of the voltage-tunable band pass filters can be made low if a high impedence amplifier is used to isolate the band pass filters from the AM demodulators, and will also increase the demodulated output voltage essentially increasing the FM demodulators sensitivity. The demodulated FM IF signal is then feedback to the voltage tuning inputs of the voltage tunable band pass filters for simultaneously tuning each band pass filter in a fashion as to tune the center frequency of the FM demodulator to closely match that of the instantaneous frequency of the IF signal thus reducing the demodulated output voltage and extending the useful demodulation band width of the demodulator. The voltage developed to tune and match the instantaneous frequency of the band pass filters to that of the IF signal is a very accurate demodulation of the incoming signal.

A second feedback loop is formed by feeding the demodulated output signal back to the local Oscillator to control its frequency in a fashion as to closely track the incoming signal in order to compress the incoming signal FM deviation at the output of the mixer. Two feedback loops are employed in the present invention. The first is used to extend demodulation band width characteristics of a narrow band AM sensitive FM demodulation. The second feedback loop is used to reduce the FM deviation of the received input signal to a much lower FM deviation in order that very narrow band pass filters in the IF amplifier stage(s) don't generate distortion of the IF signal or overmodulate the narrow band FM demodulator. Both feedback loops jointly extend receiver demodulation band width characteristics permitting the use of narrow band pass filters in both the IF stages and the demodulator. Using narrow band pass filters in both the IF stages combined with the demodulators inherently low noise detection properties significantly improves selectivity and sensitivity providing full threshold extension in a FM deviation compression feedback demodulator.

The balanced nature of the AM sensitive FM demodulator circuitry permits equal amounts of undesired offset voltages to develop at the outputs of each AM demodulator. Offsets due to temperature are produced in equal amounts by both AM demodulators but are opposite in polarity at each output. These offsets are combined and cancel at the output of the summing amplifier making the FM demodulator inherently very temperature stable. This stability has been a major factor in receiver reliability of the prior art. Due to the use of large amounts of negative feedback in the FM deviation compression feedback loop in the past, it has been customary to use complicated frequency correction circuitry in the FM demodulator to assure receiver reliability. The instant invention affords the high degree of stability needed for receiver reliability in very large feedback loop applications.

DESCRIPTION OF THE PREFERRED EMBODIMENT

Figure 1:
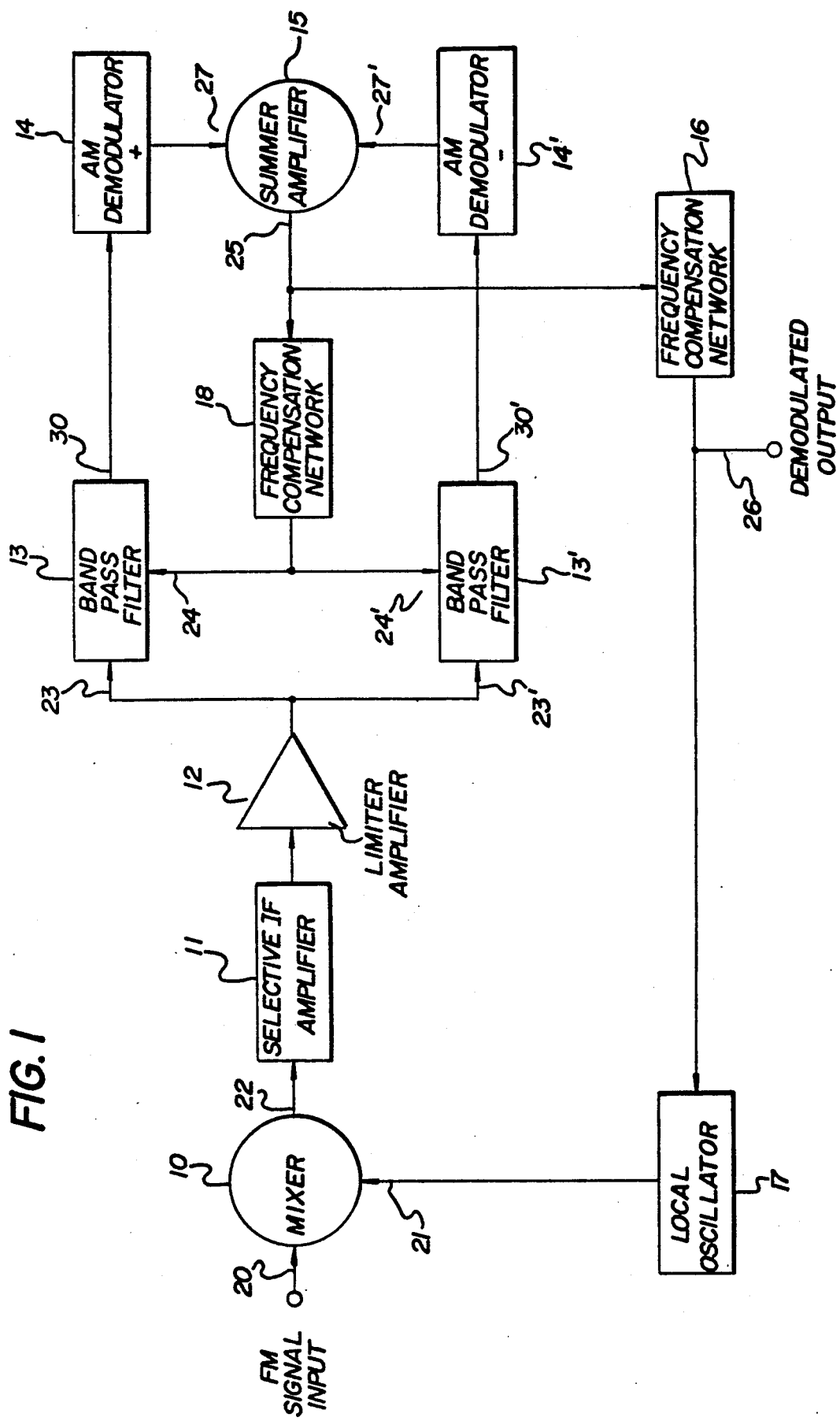
FIG. 1 is a schematic block diagram of a full threshold deviation compression feedback FM demodulator of the present invention.

FIG. 1 illustrates a block diagram of the full threshold FM deviation compression feedback demodulator of the present invention. The full threshold FM deviation compression feedback demodulator is adapted to be attached to existing FM receiving equipment or to be implemented in latter designs in order to provide full threshold of standard FM receivers.

The full threshold FM deviation compression feedback demodulator of the present invention of FIG. 1 receives an FM signal input of a prescribed FM deviation at mixer 10 input 20 and mixes with local oscillator 17 output at mixer 10 input 21 producing a converted IF signal at mixer 10 output 22 having a prescribed reduced FM deviation. The signal of reduced FM deviation is then passed through selective IF amplifier 11, where it is selectively filtered of broad band noise yet passing the IF signal undistorted. The band width of the selective IF amplifier is made wide enough as to avoid unwanted selective filtering of the desired IF signal yet narrow as possible as to remove as much broad band noise as possible. The selectively filtered IF signal of prescribed reduced FM deviation is further amplified and limited in limiter amplifier 12 and fed to a pair of band pass filters 13 and 13' at inputs 23 and 23'. Band pass filter 13 is tuned to a frequency slightly higher than the IF center frequency and band pass filter 13' is tuned slightly lower than the IF center frequency. As the IF signal frequency increases, the amplitude of band pass filter 13 output 30 increased while the amplitude of band pass filter 13' output 30' correspondingly decreases and similarly the band pass filter 13 output 30 decreases and output 30' increases when the IF signal frequency decreases.

The output 30 of band pass filter 13 is AM demodulated in AM demodulator 14 providing a positive polarity demodulation signal at its output. The output 30' of band pass filter 13' is AM demodulated in AM demodulator 14' providing a negative polarity demodulation signal at its output. These two outputs of the AM demodulators 14 and 14' are fed to summing amplifier 15 inputs 27 and 27' and are summed together in summing amplifier 15 where their difference is amplified and supplied to output 25. This signal is an accurate demodulation of the original FM signal input. This demodulated signal output 25 is feedback in a first feedback loop, through a frequency compensation network 18 to the band pass filters 13 and 13' inputs 24 and 24' for simultaneously tuning said to a center frequency which closely and substantially instaneously tracks the instantaneous frequency of the IF signal at the band pass filters 13 and 13' inputs 23 and 23'. The purpose of the feedback loop is to track the band pass filters 13 and 13' in a fashion as to reduce the AM of each band pass filters 13 and 13' and maintain a more constant amplitude and thereby reduce the demodulated signal appearing at output 25. Summing amplifier 15 provides sufficient gain to amplify this demodulated signal sufficiently for providing large amounts of feedback to the band pass filters and for a second feedback loop. A second feedback loop is formed by feeding the demodulated signal output 25 through frequency compensation network 16 back to local oscillator 17 for controlling said in a fashion as to closely track the FM signal input 20 in a manner of which reduces the FM deviation of the converted IF signal to prescribed reduced FM deviation. The demodulated signal output 26 used to track the local oscillator 17 is then an accurate demodulation of the received FM signal input 20.

Figure 2:
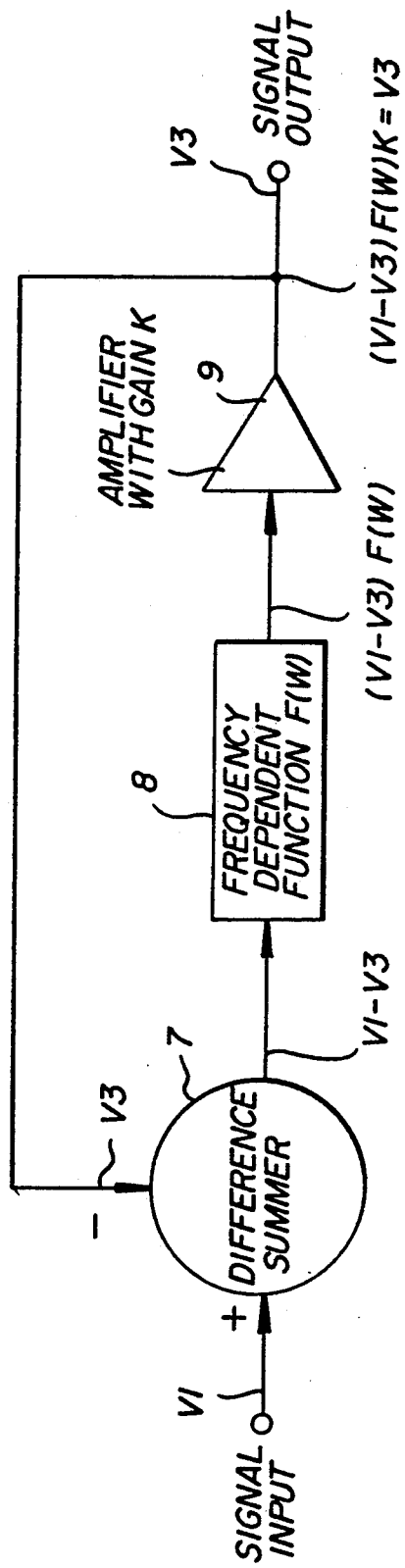
FIG. 2 is the electrical diagram of the model used in demonstrating the relationship of large feedback on a demodulation system response.

In order to fully understand the present invention it is important to understand the principles behind each feedback loop entailed. FIG. 2 represents a simple model to assist in understanding the effect of large amounts of feedback upon a system having a frequency dependent characteristics such as a band pass filter passing a FM signal.

The signal input V1 is added with the inverted signal output V3 in summer 7 forming V1−V3 which passes through F(w) the frequency dependent function 8 forming V1−V3 F(w) signal. It is then amplified by amplifier 9 by the amount K forming the signal (V1−V3) F(w)K being the output signal V3. Therefore:
w=Radian Frequency=2 F (PI)
F(w)=Frequency Dependent Function (time varying)
K=Amplifier with Gain K
V1=Input Signal Voltage (time varying)
V3=Output Signal Voltage (time varying)
And it can be seen that V3=(V1−V3) F(w)K and equating for V3/V1 gives the closed feedback loop system frequency response of;

$$V3/V1 = \frac{F(w)K}{1 + F(w)K} \text{ or } \frac{1}{1/F(w)K + 1}$$

It can be seen from this equation that increasing the amplifier gain K causes 1/F(w)K to decrease until as K is increased toward infinity where 1/F(w)K goes toward zero, and in return the quotient V3/V1 approaches unity or V3 is approximately equal to V1 and V1−V3 is nearly zero. The output V3 is therefore independent of F(w) and the amount of signal permitted to pass through frequency dependent function 8 approaches zero (virtual ground at V1−V3).

Thus large amounts of feedback produces a very flat closed loop frequency response of the system, greatly extending its frequency response and essentially removing most of the effects of the system F(w).

It follows then that using large amounts of feedback in the instant invention improves the demodulators closed loop demodulation band width considerably even when very narrow band pass filters are used in the IF stage(s). The balanced nature of the FM demodulator circuitry subtracts and thereby cancels degrading offset voltages generated within the demodulator by summing equal but opposite amounts of these offsets at summing amplifier 15 yielding a net very stable FM demodulation output 25. This permits larger amounts of feedback to be utilized without increasing local oscillator 17 drift due to amplification of offsets in summing amplifier 15. These offsets would be transmitted through local oscillator 17 and to the converted IF signal forcing it out of the pass band of the selective IF amplifier 11 making the demodulator unreliable.

Figure 3:
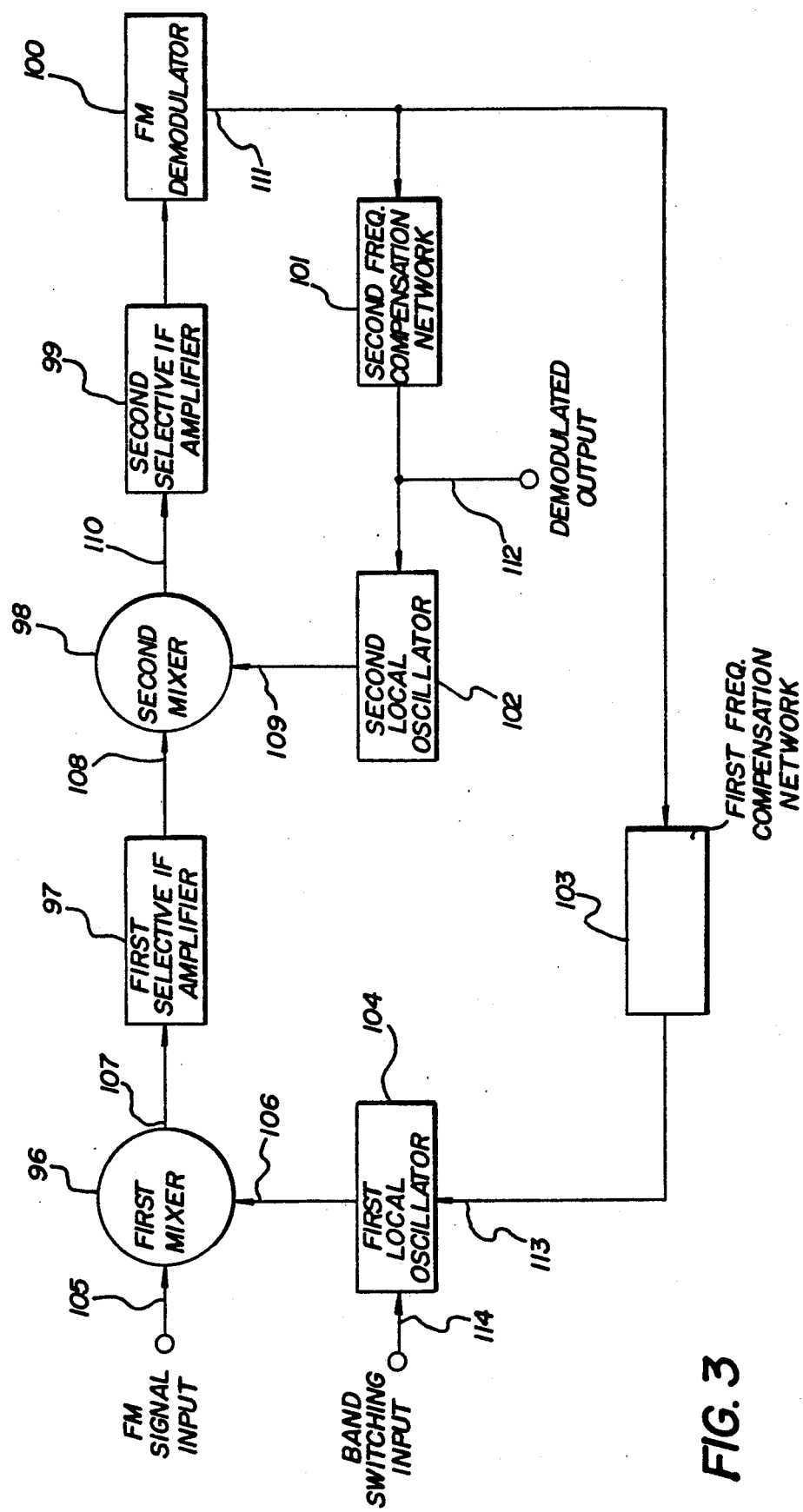
FIG. 3 is a schematic block diagram of a full threshold deviation compression feedback FM demodulator utilizing a mixer means.

In a preferred embodiment of FIG. 3, a first mixer 96 receives an input FM signal of a prescribed FM deviation at input 105 and first local oscillator 104 at mixer 96 input 106 converting said input FM signal of prescribed FM deviation to a first IF signal having a first prescribed reduced FM deviation at first mixer 96 output 107. The first local oscillator 104 moderately tracks the received input FM signal in order that the FM deviation of the converted first IF signal is moderately reduced permitting the use of a narrower band pass in the first selective IF amplifier 97 than would otherwise be required. The band pass is maintained as to not degrade the desired demodulation band width of the received signal and yet still improving selectivity. After being amplified and selectively filtered in first selective If amplifier 97 is then fed to the input 108 of second mixer 98 where it is mixed with second local oscillator 102 at second mixer 98 input 109 producing an output 110 being a second IF signal having a second prescribed reduced FM deviation. The second local oscillator 102 is tracked very closely to the frequency of the first IF signal thereby greatly reducing the FM deviation of the converted second IF signal. A second control input 114 is provided at first local oscillator 104 for band switching or rapid tuning of the local oscillator to permit reception of multiple signal input bands or channels.

The second IF signal of greatly reduced FM deviation passes through the second selective IF amplifier 99 having a very narrow band width so that as much broad band noise is removed as possible yet not adversely affecting the second IF signal. After selectively filtering in the second selective IF amplifier, the second IF signal is demodulated in FM demodulator 100 producing a demodulated output 111. The FM demodulator is an AM responsive, non phase sensitive FM demodulator of the type previously described.

The FM deviation compression feedback loops are employed in the instant preferred embodiment of FIG. 3. A first feedback loop feeds FM demodulator 100 output through first frequency compensation network 103 back to first local oscillator 104 input 113 for controlling its frequency as to moderately track the received FM input signal at first mixer 96 input 105 in a fashion as to reduce the FM deviation of the converted first IF signal to a prescribed reduced FM deviation. A second feedback loop feeds FM demodulator 100 output 111 through second frequency compensation network 101 back to second local oscillator 102 for controlling its frequency as to closely track the first IF signal at second mixer 98 input 108 in a fashion as to greatly reduce the FM deviation of the converted second IF signal to a prescribed greatly reduced FM deviation. The demodulated signal appearing at output 112 and controlling second local oscillator 102 is an accurate demodulation of the original FM signal input.

A very wide range of applications is possible with the preferred embodiments. For example, if the preferred embodiment of FIG. 1 was used to demodulate commercial FM stereo, the FM signal input 20 would customarily be 10.7MC with a peak FM deviation of 150KC. This input signal would mix in mixer 10 with local oscillator 17 at input 21 producing for the example a 2.0MC IF signal at mixer 10 output 22 having a greatly reduced FM deviation of say 5KC. The IF signal is then selectively filtered in selective IF amplifier 11 having a band width of say 10KC which would remove a very large amount of broadband IF noise. The narrow band pass of the 10KC selective IF amplifier reduces the demodulation band width to only 5KC but is relatively unimportant since the feedback loops extend this band width. The IF signal would be amplified and limited in limiter amplifier 12 and supplied to each of the band pass filters 13 and 13' with band widths of about 33KC each. Band pass filter 13 could be tuned approximately 16.5KC above the 2MC IF frequency and band pass filter 13' could be tuned approximately 16.5KC below. To obtain a good AM demodulator output demodulation from AM demodulators 14 and 14', an amplifier could be supplied within each band pass filter 13 and 13' also having a low loading effect upon each band pass filter in order to obtain the high Q factor needed. The demodulation would follow as previously described producing a demodulated output voltage at summing amplifier 15 output 25. The normal demodulation band width of this AM demodulation would be under 33KC because of the 33KC band pass filters, but after feeding the demodulated signal back to the voltage-tuning inputs 24 and 24' of the band pass filters 13 and 13', the demodulation band width can be extended to well beyond 150KC. The frequency compensation network 18 is used to maintain the flatest FM demodulation response possible.

The demodulated output 25 having a restricted demodulation band width due to the selective IF amplifier 11, is then fed back to deviate the local oscillator 17 to a FM deviation of about 145KC Peak and mixing with the incoming signal reducing its FM deviation to about 5KC. Since the demodulation band width of the selective IF amplifier 11 is 5KC due to the narrow 10KC band pass, the feedback used to reduce the FM deviation of the IF signal to 5KC is also used to extend the 5KC demodulation band width of the FM demodulation to over 80KC. This permits excellent FM stereo demodulation which requires at least 53KC of band width. The frequency compensation network 16 is provided to obtain a maximally flat demodulation band width of 80KC at output 26. It can be seen that using large amounts of feedback makes it possible to use very narrow IF selective filtering of only 10KC and yet still maintain a demodulation band width of over 80KC.

In the embodiment of FIG. 3, a second group of components is added consisting of; first mixer 96, first selective IF amplifier 97, first frequency compensation network 103, and first local oscillator 104. These are used as a FM deviation compression loop to improve receiver selectivity or to reduce very high FM deviation input signals to a more moderate FM deviation. A FM deviation of 150KC could be reduced to 90KC to permit using a 180KC band width in first selective IF amplifier 97 for example. The band switching input 114 on first local oscillator 104 could be used for very rapid tuning of the oscillator for other applications not mentioned.

The preferred embodiments can be used for either narrow or very wide band FM demodulation by scaling each component to meet the desired criterion and with appropriate circuit parameters would yield comparable benefits for either application. Wider demodulation band widths could be obtained similarly by increasing IF frequency and IF filter band widths. Increasing feedback within the demodulator would provide the widest demodulation band width possible.

Although the invention has been described with references to particular means and embodiments, it is to be understood that the invention is not limited to the particulars disclosed and extends to all substitutes and equivalents included within the scope of the claims.

What is claimed is:

1. A full threshold FM demodulator utilizing FM deviation compression feedback comprising:
   a local oscillator supplying local oscillations;
   a mixer means having an input receiving an FM signal of prescribed FM deviation and an input receiving said local oscillations and converting said FM signal to a converted IF signal having a prescribed reduced FM deviation;
   an IF amplifier comprising at least one stage coupled to said mixer means output for amplifying and selective filtering of said converted IF signal within a prescribed band width;
   a FM demodulator means comprising:
   a signal amplifier rendering an output signal of said IF amplifier within a substantially constant amplitude;
   a means for coupling an output of said signal amplifier to first and second band pass filters, wherein the first band pass filter is tuned to a prescribed frequency higher than said converted IF signal's center frequency and the second band pass filter is turned to a prescribed frequency lower than said converted IF signal's center frequency;

a means responsive to AM variations of respective outputs of said first and second band pass filters for demodulating said AM variations and providing respective demodulated outputs substantially proportional to said AM variations;

a means subtractively combining the demodulations of said first and second band pass filter AM variations and providing a demodulated output signal to an output terminal of said FM demodulator; and a feedback loop feeding back said output terminal of said FM demodulator to an input of said oscillator for controlling said mixing in said mixer means in a manner as to track said FM signal of prescribed FM deviation, thereby reducing the FM deviation of said converted IF signal to the prescribed reduced FM deviation.

2. A FM demodulator as recited in claim 1 in which the said amplifier comprises a limiter.

3. A FM demodulator as recited in claim 2 in which the said limiter comprises means responsive to signal strength of at least one converted IF signal providing an output signal.

4. A FM demodulator as recited in claim 1 in which said first and second band pass filters include at least one amplifying means for amplifying output signals of said first and second band pass filters, whereby said outputs of first and second band pas filters are amplified and buffered prior to demodulation in means responsive to AM variations.

5. A FM demodulator as recited in claim 4 in which said means for amplifying comprises at least one high impedance amplifier, thereby reducing the circuit load upon first and second band pass filters.

6. A FM demodulator as recited in claim 4 in which said first and second band pass filters are high Q circuits.

7. A FM demodulator as recited in claim 1 in which the demodulation of one of the first and second band pass filter AM variations comprises a negative polarity demodulation signal, the demodulation of the other of the first and second band pass filter AM variations comprises a positive polarity demodulation signal, and said means subtractively combining the demodulations comprises an amplifier for amplifying a difference between the negative polarity and positive polarity demodulation signals.

8. A full threshold FM demodulator as recited in claim 1 further comprising a frequency compensation network interposed between the means subtractively combining the demodulations of said first and second band pass filter AM variations and the output terminal of the FM demodulator.

9. A FM demodulator as recited in claim 1 in which:
said first and second band pass filters are voltage tunable and comprise voltage tuning input means; and
a feedback loop feeds the demodulated output signal of the means subtractively combining the demodulations of said first and second band pass filter AM variations back to said voltage tuning input mans so as to control said first and second band pass filters, thereby tracking the frequency of said converted IF signal and thereby reducing the demodulated output level of said demodulated output signal and extending the demodulation band width.

10. A full threshold FM demodulator as recited in claim 9, further comprising a frequency compensation network interposed between the means subtractively combining the demodulations of said first and second band pass filter AM variations and the voltage tuning input means of the first and second band pass filters.

11. A method of demodulating a FM signal comprising the steps of:
mixing an FM signal of a prescribed FM deviation in a mixer circuit with a local oscillator signal so as to convert said FM signal to a converted IF signal;
selectively filtering and amplifying said converted IF signal;
filtering the selectively filtered and amplified converted IF signal into an upper band, centered at a marginally higher frequency than the centered frequency of said converted IF signal and a lower band centered at a marginally lower frequency than the center frequency of said converted IF signal;
deriving two AM demodulated signals proportional to signal amplitudes of the selectively filtered and amplified converted IF signal which are present in said upper and lower bands, respectively;
subtractively combining said two AM demodulated signals to obtain an output signal; and
controlling said local oscillator signal on the basis of the output signal obtained from the two subtractively combined AM demodulated signals.

12. A full threshold FM demodulator utilizing FM deviation compression feedback comprising:
a first mixer means, comprising an input receiving a FM signal of prescribed FM deviation and an input receiving first local oscillations, for converting the FM signal to a first converted IF signal having a first prescribed reduced FM deviation;
a first local oscillator supplying said first local oscillations to said first mixer means and having an output terminal and an input terminal;
a first IF amplifier comprising at least one stage coupled to said first mixer means output for amplifying and selective filtering of said first converted IF signal to within a first prescribed band width, and having an output terminal and an input terminal;
a second mixer means, comprising an input terminal coupled to the output terminal of the first IF amplifier and an input receiving second local oscillations, for converting the amplified and selectively filtered first converted IF signal to a second converted IF signal which has a second prescribed reduced FM deviation lower than said first prescribed reduced FM deviation;
a second local oscillator supplying said second local oscillations to said second mixer means, and having an output terminal and an input terminal;
a second IF amplifier comprising at least one stage coupled to the output terminal of said second mixer means for amplifying and selectively filtering of said second converted IF signal to within a second prescribed band width;
a FM demodulator means comprising:
a signal amplifier rendering an output signal of said second IF amplifier within a substantially constant amplitude,
a means for coupling an output signal of said signal amplifier to a first and second band pass filters, the said first band pass filter being tuned to at least one prescribed frequency greater than said second converted IF signal's center frequency and the said second band pass filter being tuned to at least one prescribed frequency lower than said second converted IF signal's center frequency, a means responsive to AM variations of respective output signals of said first and second band pass filters for demodulating said respective AM variations and, a means subtractively combining the demodulations of said first and second band pass filter AM variations and providing a demodulated output signal to an output terminal of said FM demodulator;

a first feedback loop coupling said output terminal of said FM demodulator back to said input terminal of said first local oscillator for controlling said first local oscillations, thereby reducing the FM deviation of said received input FM signal of prescribed FM deviation to said first prescribed reduced FM deviation of the converted first IF signal;

a second feedback loop coupling said output terminal of said FM demodulator back to said input terminal of said second local oscillator for controlling said second local oscillations, thereby reducing the FM deviation of the amplified and selectively filtered first converted IF signal to the second prescribed reduced FM deviation.

13. A FM demodulator as recited in claim 12 in which the said amplifier comprises a limiter.

14. A FM demodulator as recited in claim 13 in which the said limiter comprises means responsive to signal strength of at least one converted IF signal providing an output signal.

15. A FM demodulator as recited in claim 12 in which said first and second band pass filters include at least one amplifying means for amplifying output signals of said first and second band pass filters, whereby said outputs of first and second band pass filters are amplified and buffered prior to demodulation in means responsive to AM variations.

16. A FM demodulator as recited in claim 15 in which said means for amplifying comprises at least one high impedance amplifier, thereby reducing the circuit load upon first and second band pass filters.

17. A FM demodulator as recited in claim 16 in which the demodulation of one of the first and second band pass filter AM variations comprises a negative polarity demodulation signal, the demodulation of the other of the first and second band pass filter AM variations comprises a positive polarity demodulation signal, and said means subtractively combining the demodulations comprises an amplifier for amplifying a difference between the negative polarity and positive polarity demodulation signals.

18. A FM demodulator as recited in claim 12 in which said first and second band pass filters are high Q circuits.

19. A FM demodulator as recited in claim 12 in which:
said first and second band pass filters are voltage tunable and have voltage tuning input terminal means;
a feedback loop couples the demodulated output signal of the means subtractively combining the demodulations of said first and second band pass filter AM variations to said voltage tuning input terminal means, controlling said first and second band pass filter, thereby tracking the frequency of said converted IF signal and thereby reducing the demodulated output level of said demodulated output signal and extending the demodulation band width.

20. A full threshold FM demodulator as recited in claim 19, further comprising a frequency compensation network interposed between the FM demodulator means and the first local oscillator.

21. A FM demodulator as recited in claim 12 in which said first local oscillator provides means for band switching or band tuning.

22. A full threshold FM demodulator as recited in claim 12, further comprising a frequency compensation network interposed between the FM demodulator means the output terminal of the FM demodulator.

* * * * *